(12) United States Patent
Candy

(10) Patent No.: US 6,600,367 B2
(45) Date of Patent: Jul. 29, 2003

(54) LOW DISTORTION AMPLIFIER

(75) Inventor: Bruce Halcro Candy, South Australia (AU)

(73) Assignee: BHC Consulting Pty Ltd., South Australia (AU)

(*) Notice: Subject to any disclaimer, the term of this patent is extended or adjusted under 35 U.S.C. 154(b) by 0 days.

(21) Appl. No.: 09/915,190

(22) Filed: Jul. 24, 2001

(65) Prior Publication Data

US 2002/0021171 A1 Feb. 21, 2002

(30) Foreign Application Priority Data

Jul. 24, 2000 (AU) .......................................... PQ 8942

(51) Int. Cl.[7] ................................................ H06F 3/52
(52) U.S. Cl. ........................ 330/109; 330/103; 330/104
(58) Field of Search ................................ 330/109, 107, 330/110, 112, 200, 103, 101, 104

(56) References Cited

U.S. PATENT DOCUMENTS

| | | | | |
|---|---|---|---|---|
| 4,229,716 A | * | 10/1980 | Levi | ........................... 330/109 |
| 4,293,820 A | * | 10/1981 | Dinh | ........................... 330/109 |
| 4,301,419 A | * | 11/1981 | Calomiris | ................... 330/109 |
| 5,892,398 A | * | 4/1999 | Candy | ........................ 330/156 |

* cited by examiner

Primary Examiner—Tuan T. Lam
(74) Attorney, Agent, or Firm—Rosenthal & Osha L.L.P.

(57) ABSTRACT

An electronic amplifier providing very low distortion which includes an output stage with an output error correction stage containing two amplifiers and wherein there are at least four local negative feedback paths, an output of the first amplifier being connected to an input of output stage transistor buffers or output stage transistors through a first network, an output of the second amplifier being connected to an input of output stage transistor buffers or output stage transistors through a second network, where components of the first and second amplifier the local negative feedback paths, first and second networks and output stage transistor buffers are selected to form substantially second order local dominant pole. Also disclosed is the supply of power to said first and second amplifiers from a floating power supply means coupled to either an or the output of the output stage so that the voltage of the floating power supply will follow substantially an output voltage of the output stage.

14 Claims, 3 Drawing Sheets

LOW DISTORTION AMPLIFIER

This invention relates to both a low distortion amplifier and to a method of achieving low distortion in an amplifier.

This invention has particular application to amplifiers whose power output stage intrinsically produce most distortion at low frequencies, and in particular, at audio frequencies.

BACKGROUND ART

There has been considerable human effort into attaining low distortion in amplifiers of many applications at all frequencies. In 1950, the best audio power amplifiers produced distortion of about 0.1% at 1 kHz, and in the 1990s, this has been reduced to about 0.001% at 1 kHz, and about 0.02% at 20 kHz, although one manufacturer claims 0.0025% at 20 kHz.

The vast majority of commercial audio amplifiers more or less follow well established standard designs.

There are some exceptions: a Technics SE-A1 amplifier which is known of in some countries incorporates an A-class output stage supplied by a floating low voltage high current power supply. This power supply is connected to a B-class high voltage output stage.

An LT1166 integrated circuit is primarily intended to control the quiescent bias feeding output transistors in audio amplifiers. The LT1166 consists of a low gain transconductance differential amplifier (gain of 0.125 mho) with an inverting and a non-inverting input. The circuitry has a local negative feedback path connecting an output of the power stage to the inverting input of the transconductance amplifier. The input of the output stage is the non-inverting input of the transconductance amplifier. Two local dominant poles necessary for stability are formed by the use of shunt capacitors to ground from the transconductance amplifier's outputs. The Linear Technology application circuitry promises distortions no better than many commercial products.

In the Journal of Audio Engineering Society, vol 29, no 1/2, January/February 1981, pages 27–30, M. J. Hawksford, discloses as a mere paper publication a theoretical means of cancelling distortion in any amplifier stage, including an output stage. This is achieved by subtracting the signals feeding the output power transistors inputs from the amplifier output, and then adding this signal back into the signal driving the output transistors' inputs.

Iwamatsu in U.S. Pat. No. 4,476,442 again as a mere paper publication disclosed circuitry based on the principles of Hawksford. In one embodiment described in this patent specification, Iwamatsu discloses floating power supplies supplying the adding and subtracting circuitry. These floating supplies follow a voltage equal to the sum of the output signal plus a signal linearly proportional to current flowing through an output load. However, Iwamatsu's circuits do not include local dominant poles.

Robert R. Cordell in "MOSPOWER APPLICATIONS", Siliconix inc. ISBN 0930519-000, 1984, 6.6.3 discloses an audio power amplifier essentially the same as one of the Hawksford's circuits, but including local dominant poles required for stability. This circuit has however no provision for thermal stability, nor floating power supply rails.

The current inventor Bruce H Candy previously in U.S. Pat. No. 5,892,398 as a paper publication only, disclosed an amplifier also utilising the principles of Hawksford, but including local dominant poles required for stability, thermal tracking circuitry for thermal stability, floating power supplies which track the output signal, rather than to the sum of the output signal plus a signal linearly proportional to the current flowing through the output load as in the case of Iwamatsu. Candy also disclosed an output stage input current source load which is also supplied by power from the floating power supplies. It was possible with such an arrangement according to my experiments which were not published to attain a distortion in the order of only 1 part per million at 20 kHz at several hundred watts of output.

Williamson et al. In U.S. Pat. No. 5,396,194 describes as a mere paper publication a switch mode amplifier containing floating low voltage high current power supplies which supply an A-class amplifier. This is similar to the technics SE-A1 except that the drive circuitry is switch-mode rather than class-B and that the power supplying the A-class amplifier is derived from the switch mode power supply rather than a separate power supply.

In one of the Williamson paper descriptions there was described floating power supplies to supply small signal operational amplifiers which were connected as servo loops to control the current flowing through the output devices. There are two feedback paths containing a capacitor which form two local dominant poles which are essential for stability.

The current inventor Bruce H Candy in U.S. patent application 09/054070 describes an amplifier consisting of at least one operational amplifier, a first error correction amplifier, connected up as a servo loop to control the output voltage, as opposed to the output current as in the case of Williamson et al. These operational amplifiers are supplied by power from floating power supplies which track the output voltage.

Candy further describes a local dominant pole required for stability, and the advantages of using wide band operational amplifiers, with gain bandwidth products of more than 100 MHz. In addition, I described a second error correction amplifier, consisting of another operational amplifier, also preferably wideband, connected up as a servo loop to control the output voltage stage which includes the first error correction amplifier. In other words, I described a 2nd order local dominant pole formed by the signal path being amplified by two error correction stages in series.

This also is supplied by the floating power supplies. I further described the advantages of implementing high gain stages with local negative feedback and the attendant local dominant poles required for stability in other stages of the amplifier to reduce distortion. This arrangement does not require the precise setting of the adding and subtracting electronics disclosed by Hawksford and related circuits.

Audio power amplifiers, or operational amplifiers, Usually consist of three definable stages, an input stage, voltage amplifier stage and output stage. In power amplifiers, the output stage, sometimes called the power output stage, usually produces most distortion. However, the distortion of the power output stage maybe substantially reduced by some of the concepts described herein.

Compared to these distortion reduced power output stages, the lowest distortion conventional input stages, voltage amplifier stages may produce substantially greater distortion.

Conventional low distortion input stages are usually a differential voltage to current converter which produce a differential output current. In these low distortion traditional architectures, the differential current output of this input stage is connected to a current mirror, and the output node of the differential current output of the input stage and current mirror is connected to a common emitter cascode amplifier; said common emitter amplifier sometimes being a Darlington. The amplifier's dominant pole is set by a network including a capacitor connected between the output and input of this common emitter cascode stage. Details of these stages are described in a review by Douglas Self in a series of articles in "Electronics World+Wireless World" from August 1993 to January 1994, and also in his book, ISBN 0-7506-2788-3, "Audio power amplifier design handbook", Newness, Reprinted 1997/1998, and the second edition ISBN 0 7506 4527 X, 2000. Another review is given by Ben Duncan, High Performance Audio Power Amplifiers, ISBN 0 7506 2629 1, Newness 1996.

An object of this invention is to provide a further circuit arrangement which assists in construction of even more accurate amplifiers or at the least, provides the public with a useful alternative.

DISCLOSURE OF THE INVENTION

In one form of this invention although this may not be the only or indeed the broadest form of this there is proposed an electronic amplifier having an input, and an output, and including an output stage containing output transistors being connected to the amplifier output, the output stage including an output error correction stage containing a first amplifier and a second amplifier, an input to the output stage being connected to an input of the first amplifier, wherein there are at least four local negative feedback paths, a first local negative feedback path being between an output of the output stage and an input of the first amplifier, a second local negative path being between an output of the first amplifier and an input of the first amplifier, and a third local negative feedback path being between an output of the output stage and an input of the second amplifier, and a fourth local negative path being between an output of the second amplifier and an input of the second amplifier, an output of the first amplifier being connected to an input of output stage transistor buffers or output stage transistors through a first network, an output of the second amplifier being connected to an input of output stage transistor buffers or output stage transistors through a second network, such that the first network transfers high frequencies from the first amplifier to an input of output stage transistor buffers or output stage transistors more substantially than the second network, and the second network transfers low frequencies from the second amplifier to the to an input of output stage transistor buffers or output stage transistors more substantially than the first network, such that components of the first and second amplifier, first, second, third and fourth local negative feedback paths, first and second networks, and output transistors and output stage transistor buffers, are selected to form a substantially second order local dominant pole, and the amplifier having it's input connected to an amplifier input stage, wherein the input stage may include a current mirror and a voltage amplification stage, an output of the amplifier input stage being connected to the input of the output stage, and the first and the second amplifier being supplied by power from a floating power supply means coupled to either an or the output of the output stage so that a voltage of floating power supply supplying the first amplifier and second amplifier will follow substantially an output voltage of the output stage.

Other embodiments of the invention are as defined in the attached claims.

In one preferred embodiment, the output stage contains two error correcting servo loops, a first and a second error correcting servo loop.

The first error correcting servo loop includes a first electronic amplifier, preferably a wideband amplifier, with an inverting and a non-inverting input.

The second error correcting servo loop includes a second electronic amplifier, preferably a wideband amplifier, with an inverting and a non-inverting input.

A first local negative feedback path connects an output of the amplifier to the inverting input of the first amplifier.

A second local negative feedback path is connected between the output of the first amplifier and it's inverting input; the negative feedback path includes at least one capacitor, together with the first electronic amplifier set with a local dominant pole.

A third local negative feedback path connects an output of the amplifier to the inverting input of the second amplifier.

A fourth local negative feedback path is connected between the output of the second amplifier and it's inverting input, which includes at least one capacitor, a second capacitor. The input to the error correction electronics, and thus the output stage, is at the first amplifier's non-inverting input. The output of the first amplifier is connected to the second amplifier's non-inverting input and to the input of the output transistors, or to the inputs of buffer amplifiers feeding the output transistors, via a first path including a first network, consisting of a high pass filter containing at least one capacitor, a third capacitor. The output of the second amplifier is connected to the input of the output transistors, or to the inputs of buffer amplifiers feeding the output transistors, via a second path including a second network which includes at least one resistor. The first path passes mostly, or only, high frequency signals to the inputs of the output transistors, or to the inputs of buffer amplifiers feeding the output transistors. The second path passes mostly or only lower frequency signals, including direct current signals, to the inputs of the output transistors, or to the inputs of buffer amplifiers feeding the output transistors. The components of the first and second amplifier, first, second, third and fourth local negative feedback paths, first and second networks, and output transistors and output stage transistor buffers, are selected to form a substantially second lower order local dominant pole. The power supplies supplying the first and second error correcting servo loops, consisting of the first and second amplifiers, first and second networks, first and second paths and first through to fourth local negative feedback paths, are floating power supplies which substantially track the amplifier's output signal. Thus high frequency stability of the output stage is mostly determined by the first electronic amplifier and the first local dominant pole, and thus high frequency stability is relatively independent of the second electronic amplifier with it's second local dominant pole. Thus the combination of the first and second error correcting servo loops creates a 2nd order local dominant pole as does the disclosure of Candy in U.S. patent application 09/054070, but herein the high frequency path does not include the second electronic amplifier as does the amplifier disclosed by Candy.

In order to successfully apply a reasonable amount of global negative feedback to the whole amplifier, and local negative feedback to the first and second error correcting servo loops, whilst maintaining a safe margin of stability, the frequency at which the closed loop phase shift exceeds 90 degrees of the whole output stage including the error correcting servo loops, should remain similar to that intrinsic to the output power transistors plus their buffers. Typical complementary voltage follower power MOSFET stages have useful responses up to a few MHz for unconditional stability. Above this frequency, the phase shift can substantially exceed 90 degrees, in which case at these frequencies, the open loop gain of any servo loop about which negative feedback is to be applied should be of the order of unity. Thus, the amplifiers employed in these servo loops should have gain-bandwidth products substantially more than a few MHz so that the intrinsic closed loop phase shifts of these amplifiers add little to the total phase shift. As "video" or "wideband" operational amplifiers are now of low cost and common, these are suitable.

In the simplest case where the first local negative feedback path consists of a resistor, say 470 ohms, and the third local negative feedback path likewise, and the second local negative feedback path consists of a capacitor, say 150 pF, and the fourth local negative feedback path likewise, but 1 nF, and the first path first network) consists of a capacitor of say 2.2 nF, and the second path (second network) consists of a resistor of say 220 ohms, with the second and fourth local negative feedback paths closed, but the first and third open, the open loop gain of the servo loops at a few MHz is of the order of 1, and the amount of negative feedback at 20 kHz is a couple of thousand times. Thus the reduction in distortion of this stage may be three orders of magnitude.

In accordance with the teaching of this invention, an amplifier has been built that produces distortion harmonics to a 20 kHz sinewave of a few hundred parts per billion, that is of the order of −130 dB at several hundred watts output power.

The advantages of this arrangement compared to the arrangement disclosed by the current inventor Candy in U.S. patent application 09/054070 is two fold.

First, the phase shift at high frequencies is less, and hence, more global or local feedback may be applied. Second, the second electronic operational amplifier may have a more relaxed high frequency specification because the high frequency response delay is set by the lower supply voltage first operational amplifier, and the higher open loop gain operational amplifiers are more readily available with more relaxed high frequency specifications.

This error corrected output stage may produce substantially less distortion than conventional input stages and voltage amplifier stages. Hence to take full advantage of the low distortion of the error-corrected output stage disclosed herein, the other stages also need to be improved upon.

These stages may be substantially improved by the application of additional servo loops and local dominant poles forming networks required for stability. In particular, the distortion generated by conventional current mirrors and the voltage amplifier may be substantially reduced by local negative feedback.

A very low distortion current mirror may be implemented by passing the controlling current through a third resistor, across which a potential difference occurs according to Ohm's law. This voltage is then fed to a high input impedance voltage to current converter. For example, the resistor through which the control current flows is connected to a first power supply. The input current end of this first resistor is connected to a non-inverting input of an operational amplifier. The operational amplifier's output is fed to the control input of a transistor, preferably being a very low capacitance type with high gain. Two small signal wideband (RF) bipolar devices connected as a Darlington pair are suitable, with the input base as said input. The output emitter of this pair is connected to a fourth resistor and to the inverting input of said operational amplifier. The other end of the fourth resistor is connected to the first power supply. The collector outputs of the Darlington pair produces a current accurately in proportion to the first and second resistor ratio and in proportion to the control current. Note there is a high degree of local negative feedback. Assuming the operational amplifier is unity gain stable, then the local dominant pole required for stability is built within the operational amplifier. If said operational amplifier is a wideband device, then the phase lag at high frequency will be relatively small, and thus have no substantial effect on the stability requirements of the amplifiers overall negative feedback. The recommended low capacitance requirement of the wideband Darlington will ensure minimal variable capacitance distortion as a function of variable voltage at high frequency.

A very low distortion voltage amplifier stage with a very high impedance virtual earth input may be implemented using high open loop gain local negative feedback with attendant local poles required for stability. For example, two amplifiers may be connected within the voltage amplifier stage, one may be used to correct for the base-emitter non-linearities of the voltage amplifier stage amplifying transistors, that is to ensure an accurate voltage to current conversion, and the other may be used both to increase the lower frequency open loop gain and also to implement a high input impedance.

In all three areas of substantially improved accuracy described herein, namely the power output stage, the current mirror and voltage amplifier stage, the closed loop phase shift at high frequency is approximately unchanged, but the distortion greatly improved compared to the conventional art. This is achieved by employing wideband-gain components with substantial local negative feedback whilst attaining stability by the implementation of local dominant pole forming networks. In each case, the local negative feedback corrects for nonlinearities of local transistors without affecting the intrinsic closed loop gain and phase shift of the stage, that is the closed loop gain/phase shift without the error correction electronics connected into the circuitry.

The above and below descriptions describe amplifier circuitry which is not symmetrical relative to the positive and negative power supply rails. This is for simplicity, and the same basic description could equally be applied to more or fully symmetric circuitry.

BRIEF DESCRIPTION OF THE DRAWINGS

For a better understanding of this invention it will now be described with reference to preferred embodiments which are described hereinafter with reference to drawings wherein

Referring to FIG. 1, the input to this output stage error correction electronic schematic, the input to the output stage 70 is connected to a constant current source 71, which provides the quiescent current to voltage amplifying stage, and 70 is also connected to an input of the first error correcting servo loop, namely the non-inverting input of the first electronic amplifier 103. 71 is unnecessary if the voltage amplifying stage is symmetrical relative to the supply rails. 70 is connected to 103 via a small valued resistor 102 inserted for very high frequency stability purposes. 71 is connected to a first floating power supply, namely, a positive voltage rail 100 whose voltage follows the output rail voltage on output signal rail 18. The positive power supply pin of 103 is connected to an output 104 of a linear voltage regulator 112. The input of 112 is fed from the positive floating power rail 100.

Figure 1:
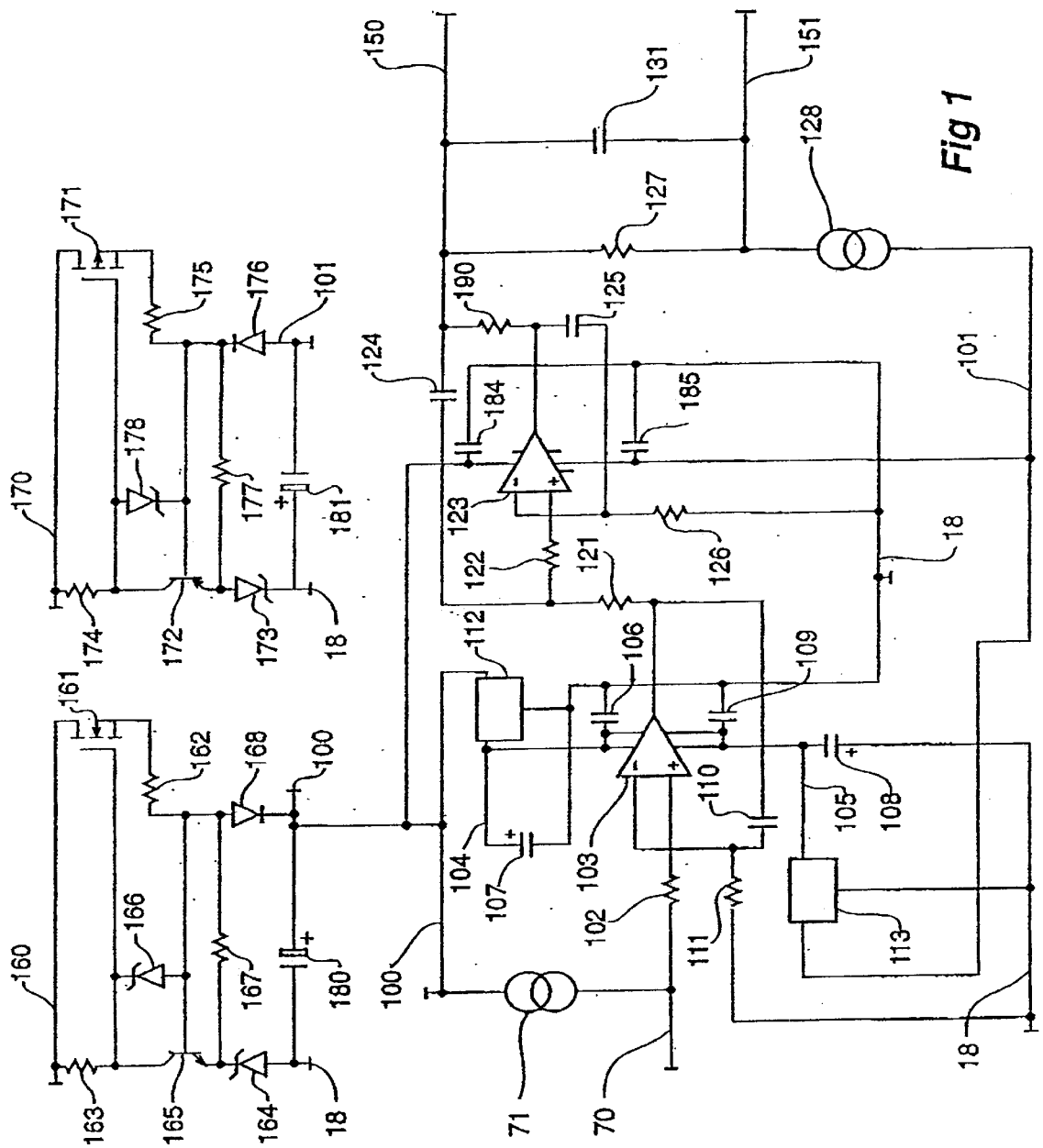
FIG. 1 shows for the embodiment incorporating this invention, a second order local dominant pole output stage error correction electronic schematic, including separated high and low frequency signal paths.

The reference "ground" pin of 112 is connected to the output signal rail 18. The negative power supply pin of 103 is connected to an output 105 of a linear voltage regulator 113. The input of 113 is fed from a negative floating power rail 101. The reference "ground" pin of 113 is connected to the output signal rail 18. Capacitors 107 and 106 a.c. couple 104 to 18 and capacitors 108 and 109 a.c couple 105 to 18. A first local feedback path connects amplifier output 18 to the first electronic amplifier 103 by means of the connection between 18 and the inverting input of 103 via resistor 111. A second local feedback path connects the output of the first electronic amplifier 103 and it's inverting input by a network which is simply capacitor 110 in this embodiment.

The values of 111 and 110 and the gain of 103 partly define the second order local dominant pole. A high frequency path, consisting of a first network consisting of resistor 121 and series capacitor 124 which connects the output of 103 to an input node 150 of N-channel output FET buffer stages consisting of amplifiers 200, 220, and 240. 121 is a small valued resistor inserted for very high frequency stability purposes. The node connecting 121 to 124 also is connected to an input of a second electronic amplifier 123, namely to its non-inverting input. This connection is made via a small valued resistor 122 inserted for very high frequency stability purposes. The positive power supply pin of 123 is connected to positive floating power rail 100. The negative power supply pin of 123 is connected to negative floating power rail 101. Capacitor 184 a.c. couples 100 to 18 and capacitor 185 a.c couples 101 to 18. A third local feedback path connects the amplifier output 18 to the second electronic amplifier 123 by means of the connection between 18 and the inverting input of 103 via resistor 126. A fourth local feedback path connects the output of the second electronic amplifier 123 and it's inverting input via a network which in this preferred embodiment consists of capacitor 125. A second network consisting of resistor 190 connects a low frequency path between the output of 123 and the input node 150 of the N-channel output FET transistor buffers. It is assumed that 121 is substantially less in value than 190. The values of 111, 110, 121, 124, 125, 126, 190 and the gains of 103 and 123 together with the output transistors and output transistor buffers define the second order local dominant pole of this output stage error correction electronic schematic. The node 150 connecting 190, 124 and the inputs of the N-channel output FET buffers, is also connected to resistor 127 and parallel capacitor 131. A node 151 which joins 127 and 131 at their other ends is connected P-channel output FET buffers 210, 230, 250. This node 151 is also connected to a constant current source 128 which is connected to negative floating power rail 101. The current flowing out of 128 may be a function of power output transistor temperature so that the output transistor quiescent current may be held approximately temperature independent. Capacitor 180 a.c. couples 100 to 18 and capacitor 181 a.c. couples 101 to 18.

The anode of Zener diode 164 is connected to 18, while its cathode is connected to the emitter of npn transistor 165 and resistor 167. The cathode of diode 168 is connected to 100 while its anode is connected to 167 and the base of 165 and to resistor 162 and to the anode of zener diode 166. The collector of 165 is connected to resistor 163, the cathode of 166 and the gate of N-channel FET 161. The source of 161 is connected to 162 and its drain is connected to a positive power supply rail 160. Resistor 163 is also connected to 160. 161, 162, 163, 164, 165, 166, 167, and 168 form a positive linear regulator which defines the voltage floating positive rail voltage 100.

The cathode of Zener diode 173 is connected to 18, while its anode is connected to the emitter of pnp transistor 172 and resistor 177. The anode of diode 176 is connected to 101 while its cathode is connected to 177 and the base of 172 and to resistor 175 and to the cathode of zener diode 178. The collector of 172 is connected to resistor 174, the anode of 178 and the gate of P-channel FET 171. The source of 171 is connected to 175 and its drain is connected to a negative power supply rail 170. Resistor 174 is also connected to 170. 171, 172, 173, 174, 175, 176, 177 and 178 form a negative linear regulator which defines the voltage floating negative rail voltage 101.

In order to minimise intrinsic delays of the amplifier 103, this should be a wide-band device. So to should 123, but the high frequency response of this device may be relaxed compared to 103 because 103 provides the basic high frequency transfer between 70 and 150 and 151, while 103 and 123 provide a low frequency path.

Figure 2:
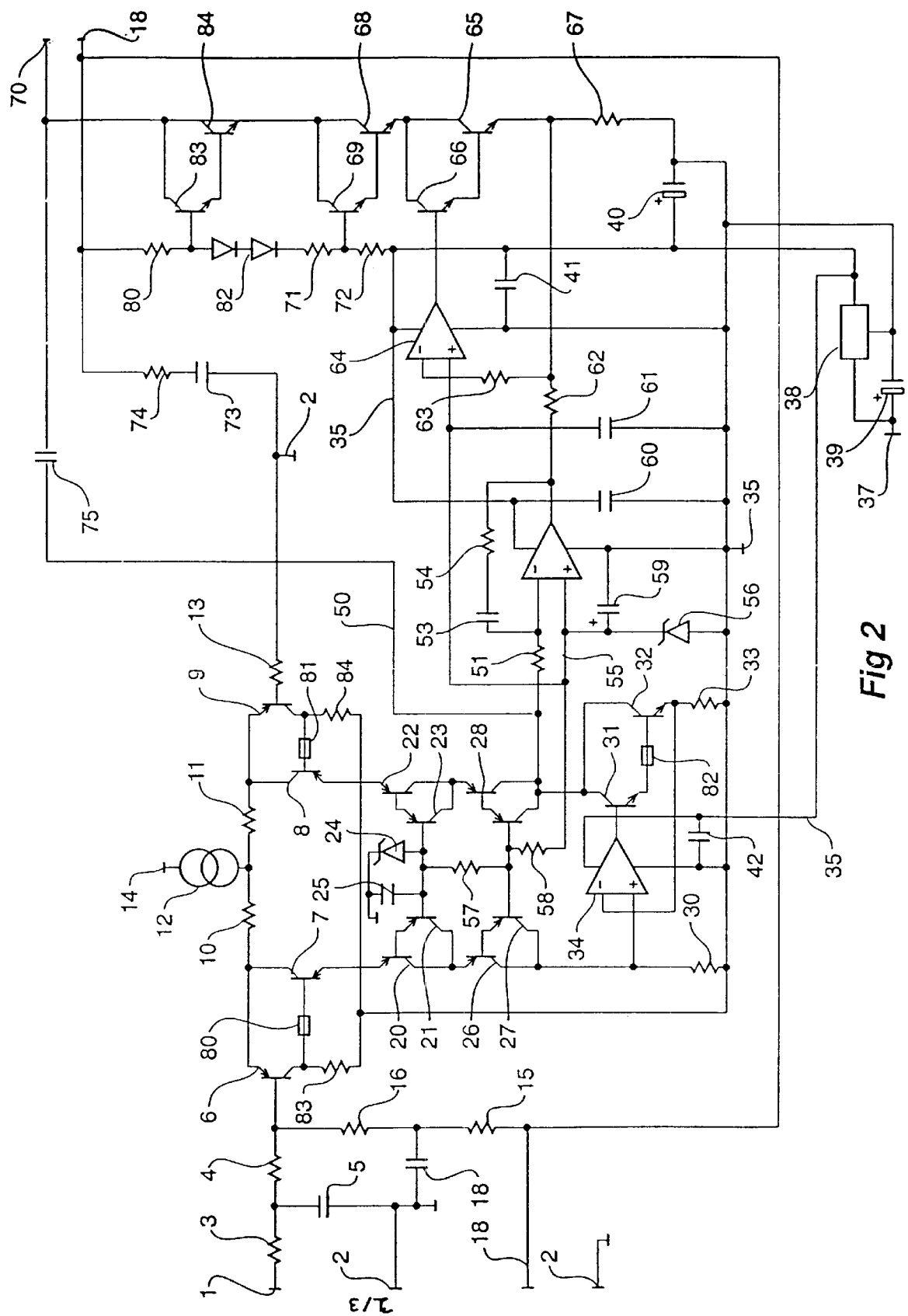
FIG. 2 shows for the same embodiment, an amplifier input stage, a low distortion current mirror, including a local feedback path and associated local dominant pole, and a low distortion voltage amplifying stage which includes a local dominant pole forming network, FIG. 3 for the same embodiment, three complementary identical parallel power output pairs are shown.

With reference to FIG. 2, the overall amplifier input is between 1 and ground 2. Resistor 3 connects 1 to resistor 4 and capacitor 5. 5 is also connected to ground 2 and acts as an r.f. block to input signals and is required to ensure overall amplifier stability. 4 is connected to the overall amplifier inverting input at the base of pnp transistor 6. Series resistors 15 and 16 connect the overall amplifier output 18 to said overall amplifier inverting input and this path is the overall amplifier's negative feedback path. A small valued capacitor 17 is connected between ground 2 and the node connecting 16 and 15. This is required for high frequency stability especially at high output currents at near voltage clipping levels. The overall amplifier non-inverting input at the base of pnp transistor 9 is connected to ground 2 via resistor 13, which is required for very high frequency stability.

Transistors 6 and 7 and 9 and 8 form a pair of complementary feedback pairs wired up as a first differential amplifier. The emitter of 6 is connected to the collector of 7 and resistor 10. The collector of 6 is connected to the base of 7 via a ferrite bead 80 required for very high frequency stability, and to resistor 83 which is also connected to a negative supply rail 36. The emitter of 9 is connected to the collector of 8 and resistor 11. The collector of 9 is connected to the base of 8 via a ferrite bead 81 required for very high frequency stability, and to resistor 84 which is also connected to the negative supply rail 36. Resistors 83 and 84 are of high value and so the current flowing though them is low and is effectively constant assuming that 36 is substantially more than 10 V. Resistor 10 and 11 are connected to each other and to their connection node, is connected a current source 12 fed from a positive power rail 14. The differential outputs of said first differential amplifier are at the emitters of 7 and 8. These each feed a series of cascode Darlington's consisting of transistors 20, 21, 22, 23, 26, 27, 28, 29. The emitter of 7 is connected to the emitter of 20 while the emitter of 8 is connected to the emitter of 22. The base input of the Darlington pair 20 and 21 is connected to the anode of zener diode 24 and decoupling capacitor 25 which is connected across 24. The cathode of 24 is connected to ground. The base input of the Darlington pair 22 and 23 is also connected to the anode of zener diode 24 which is connected to resistor 57.

The collectors of Darlington pair 20 and 21 are connected to the emitter of 26 and the collectors of Darlington pair 22 and 23 are connected to the emitter of 28. The base input of the Darlington pair 26 and 27 is connected to resistors 57 and 58, as too is the base input of the Darlington pair 28 and 29. The collectors of 26 and 27 are connected to resistor 30 and the non-inverting input of a third amplifier 34.

The negative supply to 34 is connected to supply rail 36 which is also connected to resistor 30 and resistor 33. The positive supply of 34 is connected to supply rail 35.

The output of 34 is connected to the base input of a Darlington pair of transistors 31 and 32. The emitter of 32 is connected to 33 and also to the inverting input of 34.

The emitter of 31 is connected to the base of 32 via a ferrite bead 82 which is required for stability purposes. The collectors of 28, 29, 31 and 32 are connected to the voltage amplification stage input 50, as is the overall amplifier dominant pole forming capacitor 75 and resistor 51. 58 is connected to the cathode of zener diode 56 which holds the voltage of a voltage reference rail 55. The anode of 56 is connected to supply rail 36. A decoupling capacitor 59 is connected across 56. The voltage across resistor 30 is faithfully reproduced across 33, assuming a high gain amplifier. Thus the current flowing through 30 is directly proportional to the current flowing through 33, which substantially equals the current flowing from the collectors of 31 and 32. Thus the current flowing from the collectors of 26 and 27 is in proportion to the current flowing out of the collectors of 31 and 32 according to the ratio of 30 to 33.

The high accuracy current mirror consisting of 30, 34, 31, 32, 33, 82 is owed to the local negative feedback loop. The local dominant pole is that intrinsic to amplifier 34.

50 is also connected to an inverting input of amplifier 52 via resistor 51. A non-inverting input of 52 is connected to 55. The supply to 52 is from rails 36 and 35 which is decoupled by capacitors 42, 60, 41 and 40. The output of 52 feeds resistor 62 which is also connected to resistors 63 and 67 and the emitter of transistor 65. 63 is connected to an inverting input of amplifier 64 which is also supplied from rails 35 and 36. The non-inverting input of 64 is connected to rail 55. Resistor 63 is only necessary if 64 is a "current feedback' operational amplifier. The output of 64 is connected to the input base of a Darlington pair of transistors 65 and 66. Variations in voltage at the output of 52 will be substantially proportional to variations in the output collector currents of transistors 65 and 66 owing to the local negative feedback loop of 63, 64, 65, 66. The node connecting 62, 63, 65 and 67 is a 'virtual earth" at the potential of 55, assuming the voltage across 63 is negligible. Because of this and that the potential between 55 and 36 is constant, the current flowing through 67, which is thus connected across this potential, is constant. The collectors of 65 and 66 are connected to a cascode Darlington transistor pair 68 and 69 whose collectors in turn are collected to another cascode Darlington pair of transistors 83 and 84. The input base of this the 68/69 pair is connected to a node of divider chain consisting of resistors 71, 72 and 80 and dual series diode 82. This divider chain divides the voltage between the amplifier output 18 and rail 35. The collectors of 83 and 84 feed the output of the voltage amplification stage 70 and the input of the error corrected output stage. The amplifier overall dominant pole forming capacitor 75 is connected to 70.

Voltage variations at the output of 52 are thus in proportion to current variations at the output of collectors 83 and 84. The input base of this Darlington pair are connected to the node connecting 82 and 80. The inverting input of 52 is a "virtual earth" held at the potential of 55. A net output current from the collectors of 31, 32, 28 and 29 feeding into the voltage amplification stage at node 50 is fed to capacitor 75 and resistor 51. Assuming the gain of 52, 64, and Darlington's 65 and 66, 68 and 69, 83 and 84 is high, the current flowing into 51 will be very low owing to the local negative feedback and high input impedance of 52 and thus almost all the variable current flowing into the voltage amplifying stage will flow into 75. Assuming the input impedance of the error corrected output stage is reasonably high, the output voltage active variations at 70 will be accurately proportional to the integral of the net current variations from the collectors of 28, 29, 31 and 32. Thus the voltage amplification stage described herein forms a low distortion integrated input current to voltage converter. A local dominant pole is essential for local stability of the voltage amplification stage servo loop. This is implemented by the inclusion of a series capacitor 53 and resistor 54 connected between the output of 52 and the inverting input of 52. The values of 51, 53, 54, 62, 51 must be such that the closed loop gain of the voltage amplifier is stable.

Rail 35 voltage is set by the linear voltage regulator 38 whose input is connected to power rail 37 which is positive relative to 36. The "ground reference" of 38 is connected to 36 and the output to 35. Decoupling capacitor 39 is connected between 36 and 37.

The amplifier output is between 18 and ground 2. A resistor capacitor series network 74 and 73 is connected between 18 and ground 2 for stability purposes.

Figure 3:
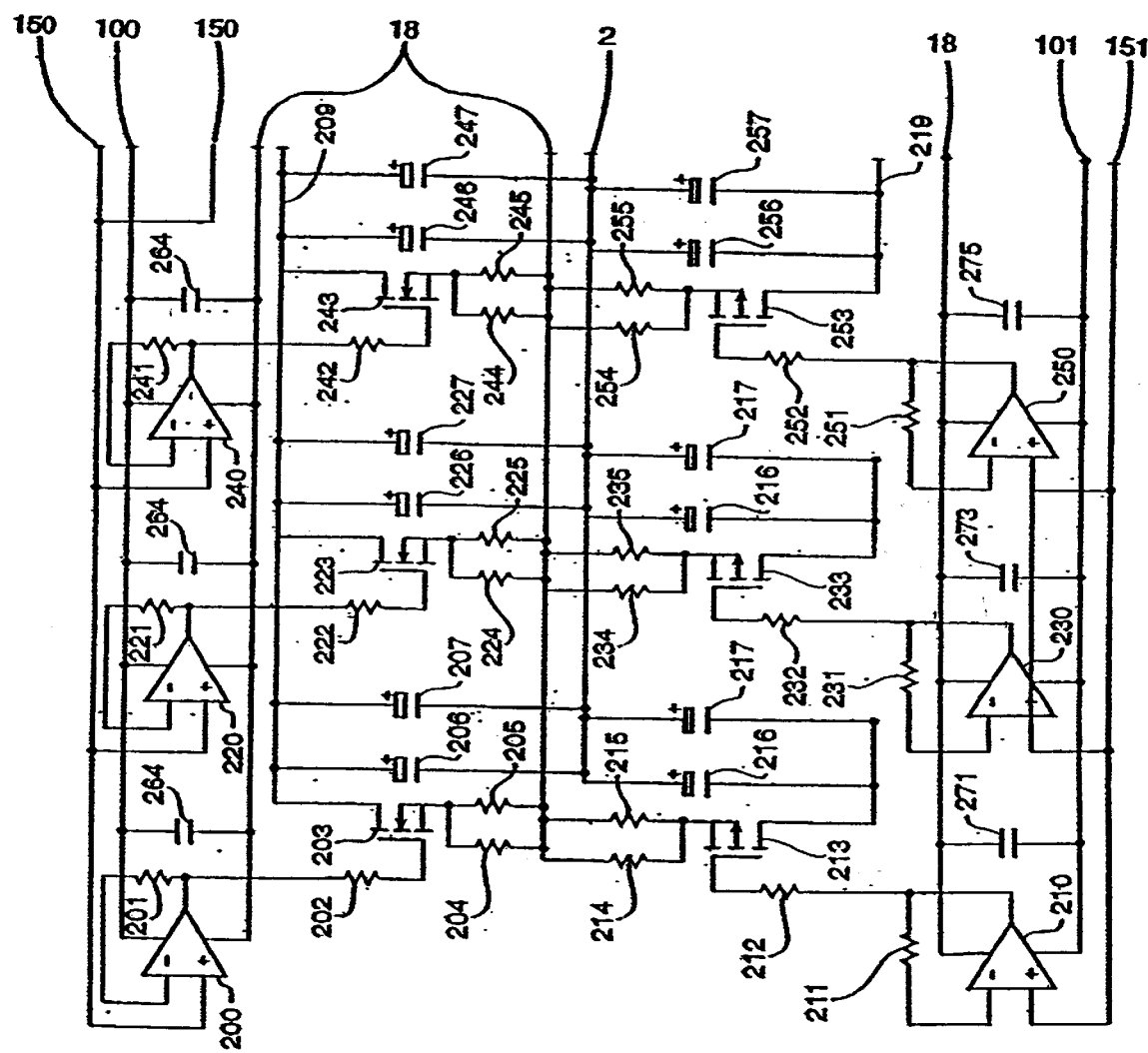

With reference to FIG. 3, three complementary identical parallel power output pairs are shown. One such pair consists of two buffer amplifiers 200 and 210, resistors 201, 202, 204, 205, 211, 212, 214, 215, an N-channel output FET source follower 203 and a P channel output FET source follower 213. The node 150 feeds and non-inverting input of 200. The supply to 200 is derived from the output signal rail 18 and the positive floating supply rail 100. The output of 200 is connected back to the inverting input of 200 via a resistor 201, which is only necessary if 200 is a "current feedback" operational amplifier. The output of 200 is connected to a resistor 202 which connects the gate of 203. The drain of 203 is connected to positive power rail 209 and its source is connected to the output signal rail 18 via parallel resistors 204 and 205. The node 151 feeds into the non-inverting input of amplifier 210. The supply to this amplifier is derived from the output signal rail 18 and the negative floating supply rail 101. The output of 210 is connected back to the inverting input of 210 via a resistor 211, which is only necessary if 210 is a "current feedback" operational amplifier. The output of 210 is connected to a resistor 212 which connects the gate of 213. The drain of 213 is connected to negative power rail 219 and its source is connected to the output signal rail 18 via parallel resistors 214 and 215. 200 and 210 may simply be a "buffer amplifiers." Decoupling capacitors 206 and 207 are connected between 209 and ground 2 and decoupling capacitors 216 and 217 are connected between 219 and ground 2. Decoupling capacitor 264 is connected between floating rail 100 and 18 and decoupling capacitor 271 is connected between floating rail 101 and 18.

This complementary pair of output transistors are simply source followers whose gates are supplied by buffers.

Any number of these stages may simply be connected in parallel as shown in FIG. 3, for example, where 3 such parallel pairs are shown. The role and connections of the following are identical: amplifiers 200, 220, 240, resistors 201, 221, 241, capacitors 264, 260, 262, resistors 202, 222, 242, N-channel power transistors 203, 223, 243, resistors 204, 205, 224, 225, 244, 245, amplifiers 210, 230, 250, resistors 211, 231, 251, capacitors 271, 273, 275, resistors 212, 232, 252, P channel transistors 213, 233, 253, resistors 214, 215, 234, 235, 254, 255, capacitors 206, 207, 226, 227, 246, 247 and capacitors 216, 217, 236, 237, 256, 257. The reason for the buffer associated with of each power transistor is that when many are used in parallel, the phase shift along the signal rails 150 and 151 relative to 18 at frequencies of the order of a MHz becomes highly significant with distance from 103, 121, 124 and 131 if these buffers are omitted, and 150 is connected directly to 202, 222 and 242, and 151 to 212, 232 and 252, but is not significant if the buffers are implemented assuming their input impedances and relatively high, and each buffer is in reasonably close proximity to its associated output transistor.

All the amplifiers employed in the local negative feedback loops and output transistor buffer amplifiers should be wideband devices for best results, namely 34, 52, 64, 103, 123, 200, 220, 240, 210, 230, 250. This is so that the closed loop phase shifts intrinsic to these devices is small at several MHz compared to the phase shifts associated with the local transistors within these local negative feedback paths whose non-linear characteristics are being corrected by these local negative feedback paths. Thus components external to these wideband amplifiers have values selected to maintain stability. The external components that a designer would select specifically for local negative feedback stability are 111, 110, 121, 124, 190, 125, 126, 51, 53, 54, and 62. It is also advantageous to employ wideband transistors, especially in the higher small current paths, namely 7, 8, 20, 22, 26, 28, 32, 65, 68, and 84 so that the phase shift of the overall amplifier at several MHz is dominated by the 90 degree phase shift of the voltage amplifier stage and the phase shift of the output transistors, assuming these are high power devices. This will enable a relative high degree of overall negative feedback and hence less distortion. It is also advantageous if these wideband devices have high gains and all the small signal transistors have low capacitance so that distortion arising from nonlinear capacitance is avoided. For integrated circuit operational amplifiers, wideband could be considered to be a gain bandwidth product of more than 100 MHz, high gain means an open loop gain of more than say 100 V/V, and a wideband transistor is a device with a transition frequency exceeding 500 MHz.

The dominant pole is defined by the overall amplifier open loop gain with all local negative feedback paths closed, and the valve of capacitor 75; the dominant pole forming capacitor.

FET voltage followers are chosen rather than power bipolar devices because of secondary breakdown considerations and because in class-B or AB, the cross-over distortion of bipolars will typically cause distortion substantially more than the performance cited above at 20 kHz.

What is claimed is:

1. An electronic amplifier having an input, and an output, and including an output stage containing output transistors being connected to the amplifier output, the output stage including an output error correction stage containing a first amplifier and a second amplifier, an input to the output stage being connected to an input of the first amplifier, wherein there are at least four local negative feedback paths, a first local negative feedback path being between an output of the output stage and an input of the first amplifier, a second local negative feeback path being between an output of the first amplifier and an input of the first amplifier, and a third local negative feedback path being between an output of the output stage and an input of the second amplifier and, a fourth local negative path being between an output of the second amplifier and an input of the second amplifier, an output of the first amplifier being connected to an input of the output stage transistor buffers or output stage transistors through a first network, an output of the second amplifier being connected to an input of output stage transistor buffers or output stage transistors through a second network, such that the first network transfers high frequencies from the first amplifier to an input of output stage transistor buffers or output stage transistors more substantially than the second network, and the second network transfers low frequencies from the second amplifier to the input of output stage transistor buffers or output stage transistors more substantially than the first network, such that components of the first and second amplifier, first, second, third and fourth local negative feedback paths, first and second networks, and output transistors and output stage transistor buffers, are selected to form a substantially second order local dominant pole, and an input stage, wherein the input stage includes a current mirror and a voltage amplification stage, an output of the input stage being connected to the input of the output stage, and the first and the second amplifier being supplied by power from a floating power supply means coupled to either an or the output of the output stage so that a voltage of floating power supply supplying the first amplifier and second amplifier will follow substantially an output voltage of the output stage.

2. An electronic amplifier as defined in claim 1 wherein the first amplifier is a first wideband differential operation amplifier.

3. An electronic amplifier as defined in claim 2 wherein the first wideband operational amplifier consists of a differential input operational amplifier with a unity gain bandwidth of greater than 100 MHz and direct current open loop differential gain of more than 100 V/V.

4. An electronic amplifier as defined in claim 3 wherein the second amplifier is provided as a second wideband operation amplifier.

5. An electronic amplifier as defined in claim 4 wherein the second wideband operational amplifier consists of a differential input operational amplifier with a unity gain bandwidth of greater than 100 MHz and direct current open loop differential gain of more than 100 V/V.

6. An electronic amplifier as defined in preceding claim 1 wherein the buffers are each a wideband device.

7. An electronic amplifier as defined in preceding claim 1 wherein said buffers are supplied by power from said floating power supply.

8. An electronic amplifier as defined in claim 1 wherein within the input stage at least one current mirror includes at least one amplifier, a third amplifier, and at least one local negative feedback path connected to an input of said third amplifier and transistors supplying an output current, wherein said local negative feedback path acts to maintain a proportional current mirror output current to the current mirrors input current when the current mirror is operational.

9. An electronic amplifier as defined in claim 1 wherein there is included a first resistor to which the current mirror input current is fed, a third amplifier including a non-inverting input to which said first resistor is connected, said third amplifier also including an inverting input to which a second resistor and first transistor are connected, said first transistor being a single bipolar or FET transistor or Darlington pair, and an output of the third amplifier being connected to a control input of the first transistor, and said first transistor supplying an output current.

10. An electronic amplifier as defined in claim 1 wherein the voltage amplification stage includes at least a fourth amplifier and a fifth amplifier, and at least a fourth local negative feedback path, a fifth local negative feedback path which includes a dominant pole forming capacitor, being connected between an output of said voltage amplification stage to an input of the voltage amplification stage, a sixth local negative feedback path which is connected between an input of the fourth amplifier and an output of the fourth amplifier, a seventh local negative feedback path, which is connected between an input of the fifth amplifier and via a third network to an output of the fourth amplifier, and a fourth network from the output of the fourth amplifier to a second transistor, which is a single bipolar or FET transistor or Darlington pair, and an output of the fifth amplifier being connected to a control input of the second transistor, and current from a third transistor supplies an output current to the voltage amplification stage output, which passes through cascode transistors, the output of the voltage amplifier being also connected to the input of the output stage, the input to the voltage amplification stage being connected to an output of the said current mirror.

11. An electronic amplifier of claim 1 wherein the output stage contains two error correcting servo loops, a first and a second error correcting server loop, the first error correcting servo loop including the first amplifier, having an inverting and a non-inverting input, the second error correcting servo loop including the second amplifier, having an inverting and a non-inverting input, a first local negative feedback path connects an output of the amplifier to the inverting input of the first amplifier, a second local negative feedback path is connected between the output of the first amplifier and its inverting input; the second negative feedback path includes at least one capacitor, together with the first amplifier set with a local dominant pole, a third local negative feedback path connects an output of the amplifier to the inverting input of the second amplifier, a fourth local negative feedback path is connected between the output of the second amplifier and its inverting input, which includes at least one capacitor, a second capacitor, the output of the first amplifier is connected to the second amplifier's non-inverting input and to the input of the output transistors, or to the inputs of buffer amplifiers feeding the output transistors, via a first path including a first network, consisting of a high pass filter containing at least one capacitor, a third capacitor, the output of the second amplifier is connected to the input of the output transistors, or to the inputs of buffer amplifiers feeding the output transistors, via a second path including a second network which includes at least one resistor, the first path passes mostly, or only, high frequency signals to the inputs of the output transistors, or to the inputs of buffer amplifiers feeding the output transistors, the second path passes mostly or only lower frequency signals, including direct current signals, to the inputs of the output transistors, the components of the first and second amplifier, first, second, third and fourth local negative feedback paths, first and second networks, and output transistors and output stage transistor buffers, are selected to form a substantially second lower order local dominant pole.

12. An electronic amplifier according to claim 11 wherein the first and second amplifiers are wideband amplifiers.

13. An electronic amplifier according to claim 11 wherein the power supplies supplying power to the first and second error correcting servo loops consists of the first and second amplifiers, first and second networks, first and second paths and first through to fourth local negative feedback paths, are floating power supplies which substantially track the amplifiers output signal.

14. An amplifier as defined in claim 1 wherein there is further included within the output stage more than two buffers being each a buffer amplifier, the outputs of each being connected to inputs of different output transistors, wherein said buffers are located closer to the output transistors to which said buffers are connected than to the output transistors to which said buffers are not connected.

* * * * *